US006970062B2

(12) United States Patent
Mulder

(10) Patent No.: US 6,970,062 B2
(45) Date of Patent: Nov. 29, 2005

(54) COOLING OF A MRI SYSTEM

(75) Inventor: Gerardus Bernardus Jozef Mulder, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/498,728

(22) PCT Filed: Dec. 18, 2002

(86) PCT No.: PCT/IB02/05622

§ 371 (c)(1),
(2), (4) Date: Jun. 15, 2004

(87) PCT Pub. No.: WO03/054893

PCT Pub. Date: Jul. 3, 2003

(65) Prior Publication Data

US 2005/0104700 A1    May 19, 2005

(30) Foreign Application Priority Data

Dec. 21, 2001  (EP) .................................. 01205130

(51) Int. Cl.⁷ .............................................. H01F 5/00
(52) U.S. Cl. ..................................... 335/300; 505/892
(58) Field of Search    335/216, 296–300; 324/318–322; 505/892–899

(56) References Cited

U.S. PATENT DOCUMENTS

| 5,936,499 A | 8/1999 | Eckels et al. |
| 6,011,456 A | 1/2000 | Eckels et al. |
| 6,150,912 A | 11/2000 | Elgin et al. |
| 6,289,681 B1 * | 9/2001 | Eckels et al. ................. 62/47.1 |

FOREIGN PATENT DOCUMENTS

| EP | 0 720 024 B1 | 11/2001 |
| GB | 2 298 927 | 9/1996 |

* cited by examiner

Primary Examiner—Lincoln Donovan
(74) Attorney, Agent, or Firm—Fay, Sharpe, Fagan, Minnich & McKee

(57) ABSTRACT

A magnetic resonance imaging (MRI) system having an open superconducting magnet system (1) includes a number of horizontally oriented superconducting coils (3–10) in a cryogenic container (11). The cryogenic container contains a liquid cooling medium for cooling the superconducting coils which are located within the cryogenic container. At its top, the cryogenic container is provided with a recondensor (23) for continuously liquefying the cooling medium. The magnet system has a circuit for guiding the liquid cooling medium from the recondensor along at least part of the superconducting coils.

17 Claims, 2 Drawing Sheets

COOLING OF A MRI SYSTEM

CROSS-REFERENCE TO RELATED APPLICATIONS

This application is the U.S. national stage entry of PCT Application No. PCT/IB02/05622 (Publication No. WO 03/054893), filed Dec. 18, 2002, the benefit of which is hereby claimed.

BACKGROUND

The invention relates to a magnetic resonance imaging (MRI) system having an open superconducting magnet system, which comprises a number of horizontally oriented superconducting coils and a cryogenic container for containing a liquid cooling medium for cooling the superconducting coils which are located within the cryogenic container, the cryogenic container being provided, at its top, with a recondensor for continuously liquifying cooling medium evaporating from the container.

An MRI system as mentioned in the opening paragraph is known from U.S. Pat. No. 6,011,456. This patent describes an open architecture recondensing superconducting magnet having a cryogenic container, being a helium vessel, for a superconducting MRI magnet in which the so-called "Zero-Boil-Off" (ZBO) technique is used for conservation of the helium coolant. The ZBO technique itself is a technique that aims to prevent loss of helium (or any other coolant) by means of a recondenser that re-liquefies the helium gas somewhere in the top of the helium vessel instead of letting it escape as a gas. In a magnet with a recondenser, the helium that evaporates cannot escape the helium vessel, because in the exit path (somewhere in the neck at the top of the magnet) it will encounter the cold surface of the recondenser, which causes the helium gas to liquefy. The recondensed helium then drips into the helium vessel again. So, there is continuous circulation of the helium. Typically, in an MRI magnet according to the invention, the heat leak is of the order of 1 W, causing an evaporation of 1.4 litres/hour of liquid helium. As a result, about 14 litres/hour of 4.2 K helium gas try to escape the helium vessel, which is quite a large amount compared to conventional MRI magnets not having an open structure. So strictly speaking, the term "zero-boil-off" is not correct.

A further detail of the ZBO technique is that uncontrolled operation of the cryocooler may lead to underpressure in the helium vessel which is undesirable. The solution consists in controlling the pressure by means of a heater at the bottom of the helium vessel. In fact the heater spoils the excess cooling capacity of the recondensor. This ensures a constant circulation of helium, regardless of the quality of the cryostat.

As indicated, the recondensor should prevent the evaporated helium from leaving the helium vessel and does so to a large extent. However in practice some loss of helium is inevitable during service actions, failures of the cryogenic system or the existence of small undetectable helium leaks through which gas can escape the helium vessel. In other words, the helium loss averaged over a long period of time is very small but not really zero.

An important quality factor of the helium vessel in this respect is the effective volume, which is defined as the difference between the maximum fill ratio of the cooling medium and the minimum fill ratio of the cooling medium between which the magnet is allowed to operate. For example, if the maximum fill ratio is 95% of the total volume of the vessel and the minimum fill ratio is 15%, the magnet can be filled with helium to 95% and will have to be re-filled before the fill ratio drops below 15%. In this case the effective volume is 80% of the total volume of the helium vessel. Typically, for an open magnetic resonance imaging (MRI) superconducting magnet system of medical imaging systems according to the state of the art, the maximum fill ratio and the minimum fill ratio would be relatively close to each other, for example respectively 95% and 85%, in which case the effective volume is only 10%, even if the magnet is equipped with a recondenser (ZBO technique). A large effective volume is therefore interesting because it will increase the helium re-fill interval.

SUMMARY

It is an object of the invention to provide a medical imaging system the cryogenic container of which needs a re-fill of the fluid cooling medium at increased intervals or even not at all anymore during the economical lifetime of such a system.

In order to achieve said object, an MRI system according to the invention is characterized in that the MRI system comprises a circuit for guiding the liquid cooling medium from the recondensor along at least part of the superconducting coils. The cooling medium within the circuit should be capable of sufficiently cooling the superconducting coils. This does not necessarily mean that the superconducting coil is directly in contact with the cooling medium. Alternatively, sufficient cooling of the superconducting coils can also take place, for example, by using a thermal conductive intermediate material, for instance of the circuit itself, between the cooling medium and the superconducting coils. Since the circuit only necessitates the presence of the liquid cooling medium in the circuit, $V_{min}$ can be decreased drastically, thus correspondingly increasing the effective volume. For example in this manner, the invention enables the effective volume to be increased by a factor of 8, leading to an 8 times greater re-fill interval. In practice this can be the difference between re-filling every 2 years, or every 16 years. In the latter case the magnet is not expected to be re-filled at all because 16 years exceeds the economical lifetime of an MRI medical imaging system.

A particular embodiment of an MRI system according to the invention is characterized in that the circuit comprises at least one local reservoir for the liquid cooling medium, which is located close to an associated superconducting coil for cooling said associated superconducting coil. In this manner, a very efficient increase of the effective volume is achieved.

A further embodiment of an MRI system according to the invention is characterized in that the local reservoir comprises an overflow edge for the liquid cooling medium, which is located at or above a lower side of the associated superconducting coil. In this manner it is ensured that at least the lower part of the associated superconducting coil is immersed in the fluid cooling medium. Due to the very good thermal conductive properties of superconducting coils, immersing only the lower part of said superconducting coil in the fluid cooling medium is sufficient for maintaining the associated superconducting coil as a whole at the required reduced temperature.

A yet further embodiment of an MRI system according to the invention is characterized in that the local reservoir is at least partly ring-shaped. In this manner, the shape of the local reservoir is adapted to the general shape of the associated superconducting coil. It is not strictly necessary within the spirit of the invention that this particular ring shape encloses a full circle. Due to the good thermal conductivity properties, it also can be sufficient to limit the ring shape to for instance 15 degrees of the associated superconducting coil, thereby further decreasing the minimum fill ratio at which the magnet is allowed to operate.

A particular embodiment of an MRI system according to the invention is characterized in that the local reservoir comprises a winding body for the associated superconducting coil. Said winding body is for instance part of a so called coil former. The number of additional structural components within the cryogenic reservoir is reduced, because the winding body not only serves as a body around which the coil is wound during the manufacture of the superconducting coil, but also as a wall or restriction for the reservoir.

A similar advantage applies in a further embodiment of an MRI system according to the invention, wherein the local reservoir comprises a positioning body for the associated superconducting coil. Such a positioning body, which is for instance also part of a so called coil former, is normally present in the cryogenic reservoir anyway for avoiding unwanted deformation of the superconducting coils due to generated Lorentz forces.

A yet further embodiment of an MRI system according to the invention is characterized in that the circuit comprises downwardly sloping guides for guiding the liquid cooling medium from a first superconducting coil to a second superconducting coil which is positioned below the first superconducting coil. In this manner, an optimal routing of the fluid cooling medium is achieved. The fluid cooling medium is guided along the successive superconducting coils, with a minimal need for fluid cooling medium to be present between the superconducting coils. This is especially advantageous if the respective superconducting coils are not exactly positioned above each other.

A particular embodiment of an MRI system according to the invention is characterized in that the MRI system comprises sensor means for determining the level of the liquid cooling medium within the cryogenic container. In this manner, the fill ratio of the fluid cooling medium within the cryogenic container can be monitored. By extrapolating data derived from the sensor means, one can anticipate when, and if, a next re-fill would be necessary.

Hereinafter, the invention will be explained further by a description of a preferred embodiment of a magnetic resonance imaging (MRI) system according to the invention. For this description reference is made to the Figures, in which

DETAILED DESCRIPTION

Figure 1:
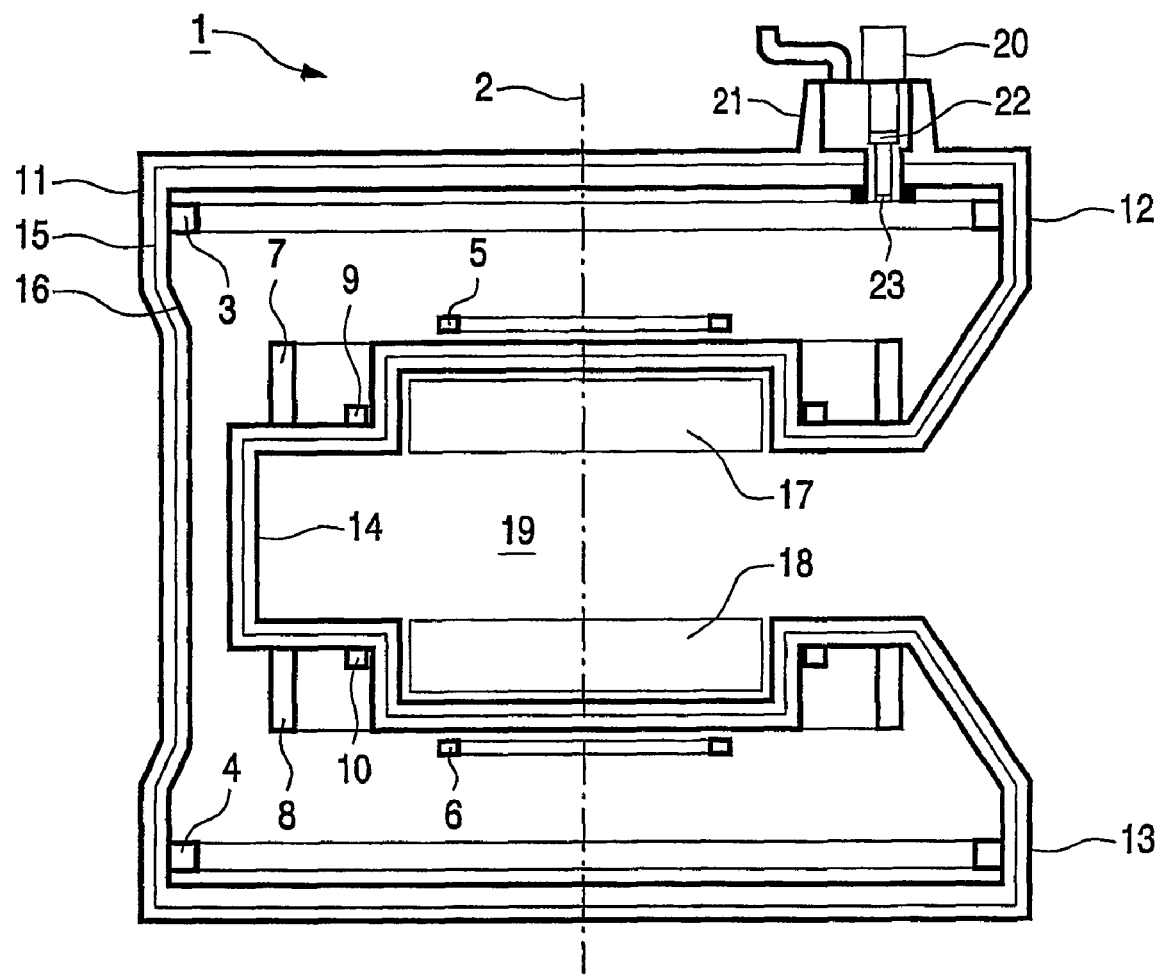
FIG. 1 diagrammatically shows a cross-section of an open superconducting magnet system of the MRI system according to the invention, however without features specific to the invention, FIGS. 2A and 2B diagrammatically show a cross-section of the magnet system according to FIG. 1, including features specific for the invention, and including a maximum level $V_{max}$ and a minimum level $V_{min}$ of helium between which the magnet system is allowed to operate.

FIG. 1 shows a schematic cross-section of an open superconducting magnet system 1, which forms part of a magnetic resonance imaging (MRI) system according to the invention. FIG. 1 does not show the specific features of the invention. The remaining parts of the MRI system, including a frame, a patient support unit and a control unit, are not shown in FIG. 1 and may be of a usual kind known to the skilled person. The magnetic field and the axis 2 of the magnet system 1 are oriented in the vertical direction. The magnetic field is generated by ring-shaped superconducting coils 3, 4, 5, 6, 7, 8, 9, 10 each lying in a horizontal plane. The two coils 3, 4 having the largest diameter constitute shield coils, which provide active shielding of the fringe field. Active shielding is the state-of-the-art method of reducing the fringe field of the magnet system 1 in order to minimize the volume occupied by the MRI system in the hospital.

In order to become superconducting, the superconducting coils 3–10 should be cooled. For such cooling the superconducting coils 3–10 are located within a cryogenic container 11. The shape of the cryogenic container 11 corresponds to the specific shape of the magnet system 1, which means that the cryogenic container 11 comprises a disc-shaped upper part 12 and a disc-shaped lower part 13, both parts 12 and 13 being interconnected at one side by a post 14. It is also possible within the scope of the invention to provide more posts, e.g. for mechanical stability, but only one post is shown in FIG. 1. Following these specific contours, a radiation shield 15 and a helium vessel 16 are present in the cryogenic container 11. This results in the helium vessel 16 being common for both the upper part 12 and the lower part 13. This is the most economical way, because if two separate helium vessels were used for the upper part 12 and the lower part 13, many components would be needed twice, including the rather expensive cryocooler, as will become clear from the description given below.

In the particular design as shown in FIG. 1, there are four superconducting coils located in the upper part 12 of the cryogenic container 11 and four superconducting coils located in the lower part 13, but this is not essential to the invention. A more homogeneous version of the magnet system may require more coils, whereas a non-shielded version of the magnet system may require fewer coils. In FIG. 1 the coils of the upper and the lower part 12 and 13 are symmetric, however, this is not necessary within the context of the invention.

The areas 17, 18 represent the positions of further components of the magnet system 1, such as gradient coils, RF coils, and a shim system, which have been recessed in recesses in the respective upper part 12 and lower part 13 of the cryogenic container 11. In this manner, maximum space is achieved for the patient within the patient space 19 between the upper part 12 and the lower part 13.

For cooling helium present within the helium vessel 16, a cryocooler 20 is provided, which penetrates into the helium vessel 16 through a neck 21 on top of the magnet. The cryocooler 20 has two heat stations 22, 23. The first heat station 22 is connected to the radiation shield 15 of the magnet system 1. The second heat station 23 floats in the helium vessel 16 and acts as a recondenser. In this particular embodiment, an advanced two-stage cyocooler is used, of which the second heat station 23 or the second stage reaches a temperature below 4.2 K and is therefore capable of recondensing helium, while the first heat station 22 or the first stage cools the radiation shield 16. However, combining the functions of recondensing and cooling the radiation shield in a single cryocooler is not essential to the invention. Alternatively, one could use a helium liquefier and a separate means to cool the radiation shield, e.g. a separate cryocooler or a nitrogen coolant.

Figure 2A:
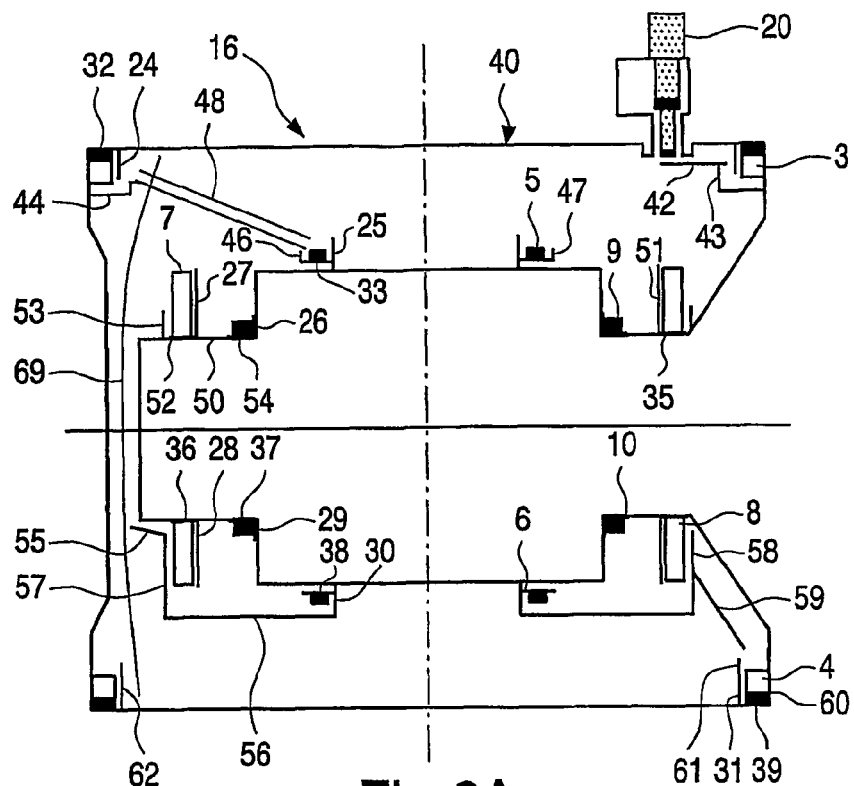
Figure 2B:
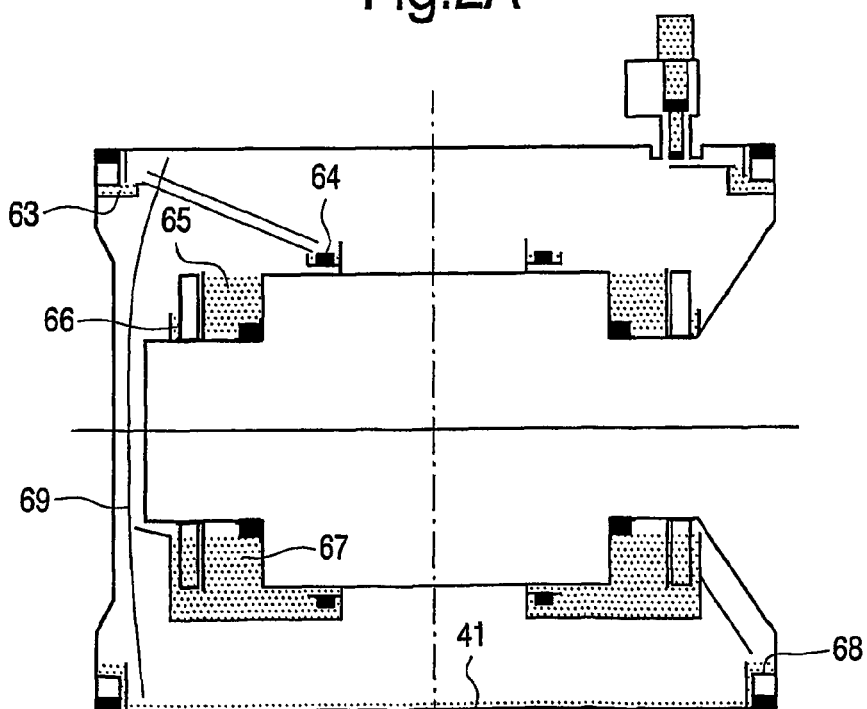

In FIGS. 2A and 2B the helium vessel 16 is shown without the surrounding cryogenic container 11 and the radiation shield 15. To improve the intelligibility of the FIGURES no lines are shown (unlike FIG. 1) for showing the rotating movement of several elements, such as the superconducting coils, within the helium vessel 16. In addition to the elements shown in FIG. 1, FIGS. 2A and 2B show winding bodies 24, 25, 26, 27, 28, 29, 30, 31 and coil formers 32, 33, 34, 35, 36, 37, 38, 39 for each superconducting coil 3–10. The superconducting coils are wound around the winding bodies during production of the magnet system 1. The coil formers are used to support the superconducting coils mechanically against Lorentz forces. The winding bodies and the coil formers would be present within the helium vessel even without applying the present invention since they are necessary anyway. Furthermore the helium present within the helium vessel 16 is shown using a grey scale.

In FIG. 2A the helium is shown at the maximum level 40 at which the magnet system 1 is allowed to operate, whereas in FIG. 2B the helium is shown at the minimum level 41 at which the magnet system 1 is allowed to operate. The difference between maximum and minimum filling is the so called effective volume that can easily reach values between 80% and 90% of the total volume of the helium vessel 16.

As described above, a dynamic balance exists within the helium vessel between on the one hand the evaporation of helium and on the other hand the liquefaction of helium by the condensor. Helium liquefied by the condensor is guided along all superconducting coils by means of a circuit. This circuit starts right below the condensor by a downwardly sloping chute 42, via which the helium can flow to a first ring-shaped local reservoir 63 having a U-shaped cross-section. The legs of the U-shape are formed by part of the helium vessel 16 itself and by a wall 43 located at the inner side of superconducting coil 3, whereas the body of the U-shape is formed by a bottom 44. On the left hand side of FIG. 2A an overflow edge 45 of wall 43 is shown, from which a downwardly sloping pipe 48 extends to just above superconducting coil 5. Coil 5 is positioned within a second ring-shaped local reservoir 64 having a U-shaped cross-section. The legs of this U-shape are formed by a part of winding body 25 and wall 46, having an overflow edge 47. The body of the U-shape is formed by a part of coil former 33. Helium overflowing overflow edge 47 will arrive at a third ring-shaped local reservoir 65 formed by winding body 27 for superconducting coil 7 and by parts 49, 50 of the helium vessel 16. The upper edge 51 of winding body 27 should be considered to be an overflow edge for the helium. After having overflown this edge 51, the helium reaches a fourth ring-shaped local reservoir 66 also having a U-shaped cross-section for superconducting coil 7. Wall 53, part 52 of helium vessel 16 and winding body 27 constitute this fourth local reservoir 66. The height of wall 53 is smaller than the height of winding body 27. For this reason, if the fourth reservoir 66 is fully filled with helium, helium will tend to overflow upper edge 54 of wall 53. Next, due to gravity, helium will fall through the part of helium vessel 16 extending through post 14, onto the upper part of a downwardly sloping chute 55, from which the helium flows down into a fifth ring-shaped local reservoir 67. This fifth local reservoir 67 serves to jointly cool superconducting coils 6, 8 and 10. The fifth local reservoir 67 is formed by winding body 30 for superconducting coil 6, which winding body 30 is at its upper end sealingly connected to the helium vessel 16. Furthermore, the fifth local reservoir 67 is formed by bottom 56 which extends underneath the three superconducting coils 6, 8 and 10, and by wall 57. On the right hand side of FIGS. 2A and 2B it can be seen that the upper edge 58 of wall 57 is positioned slightly underneath the wall of the helium vessel 16, allowing passage of helium therebetween onto downwardly sloping chute 59, which guides the helium to a sixth ring-shaped local reservoir 68. This local reservoir 68 is formed by part 60 of the helium vessel 16, by coil former 39 and by winding body 31 which is extended by extension part 61. After having overflown upper edge 62 of the extension part 61, the helium arrives at the bottom 41 of the helium vessel 16. At the bottom a heater (not shown) is present for controllably evaporating the helium in order to create a dynamic equilibrium with the recondensation of the helium by the cryocooler 20.

In order to monitor the helium level in the helium vessel 16, a level sensor 69, known to the men skilled in the art, is provided on the inside of the helium vessel. This enables continuous monitoring of the helium level. Monitoring the helium level is advisable in order to detect problems at an early stage. A drop of the helium level indicates a failure (e.g. a gas leak) that will eventually lead to loss of helium from the magnet system 1.

It will be clear from the above description and from FIG. 2B (in comparison to FIG. 2A), that in order to cool the superconducting coils to the required temperature it is sufficient if all local reservoirs 63, 64, 65, 66, 67, 68 are filled with helium. This is already achieved if only a relatively small part of the helium vessel 16 is filled with helium, since the local reservoirs have volumes which are substantially smaller than the total volume of the helium vessel 16. Liquid helium, which overflows one of the local reservoirs, arrives at a lower local reservoir, where applicable, via guiding elements such as chutes or pipes. In this manner, a continuous flow of liquid helium is achieved from the condensor to the highest local reservoir, and further to the lowest local reservoir via the intermediate local reservoirs, so that it is ensured that all reservoirs remain filled despite local helium evaporation in each local reservoir.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

What is claimed is:

1. A magnetic resonance imaging system having an open superconducting magnet system, which includes:
   a number of horizontally oriented superconducting coils, each superconducting coil being disposed in an associated local reservoir, each of the local reservoirs including an overflow edge, which is located at or above a lower side of the associated superconducting coil;
   a cryogenic container for containing a liquid cooling medium for cooling the superconducting coils which superconducting coils are located with their associated local reservoirs within the cryogenic container;
   a recondensor disposed at a top of the cryogenic container for liquifying cooling medium evaporating from the container; and
   a circuit for cascading the liquid cooling medium liquefied by the recondensor from local reservoir to local reservoir such that the cooling medium liquid flows form the overflow edge of one of the local reservoirs to a lower of the local reservoirs and from the overflow edge of the lower local reservoir to a still lower local reservoir.

2. The MRI system as claimed in claim 1, wherein each local reservoir is at least partly ring-shaped.

3. The MRI system as claimed in claim 1, wherein at least one of the local reservoirs includes a winding body for the associated superconducting coil.

4. The MRI system as claimed in claim 1, wherein at least one of the local reservoirs includes a positioning body for the associated superconducting coil.

5. The MRI system as claimed in claim 1, wherein the circuit comprises downwardly sloping guides for guiding the liquid cooling medium (a) from the one local reservoir to the lower local reservoir which is positioned below the the one local reservoir and (b) from the lower local reservoir to the still lower local reservoir.

6. The MRI system as claimed in claim 1, further including:
a sensor means for determining the level of the liquid cooling medium within the cryogenic container.

7. The MRI system as claimed in claim 1, wherein the cryogenic container includes an upper portion and a lower portion, the upper portion including a plurality of local reservoirs.

8. The MRI system as claimed in claim 7, wherein the sensor means is disposed in a well defined adjacent the bottom of the lower cryogenic container portion below an overflow edge of a lowermost of the local reservoirs.

9. The MRI system as claimed in claim 8, further including:
a heater disposed at the bottom of the cryogenic container for controllably evaporating the liquid cooling medium in order to create a dynamic equilibrium with recondensation of the evaporated cooling medium by the recondensor.

10. A magnetic resonance system comprising:
at least first and second horizontally oriented upper superconducting coils disposed above a subject receiving region;
at least first and second horizontally oriented lower superconducting coils disposed below the subject receiving region;
a cryogenic container which encompasses the first and second upper superconducting coils and the first and second lower superconducting coils, the cryogenic container having a bottom and a top;
a cooling medium disposed in the cryogenic container, the cooling medium having a liquid state in which it flows by gravity from the cryogenic container top toward the cryogenic container bottom and a gaseous state in which it rises to the cryogenic container top;
a recondensor at the cryogenic container top which condenses the gaseous state cooling medium into the liquid state;
a liquid cooling medium circuit which guides the liquid cooling medium from the recondensor to the first upper superconducting coil and from the first superconducting coil to the second upper superconducting coil and from the second upper superconducting coil to the lower superconducting coils.

11. The MRI system as claimed in claim 10, further including:
a well defined below the second lower superconducting coil, the liquid cooling medium circuit guiding the liquid cooling medium from the second lower superconducting coil to the well.

12. The MRI system as claimed in claim 10, further including:
a first upper local reservoir associated with the first upper superconducting coil holding the liquid cooling medium adjacent the first upper superconducting coil;
a second upper local reservoir associated with the second upper superconducting coil holding the liquid cooling medium adjacent the second upper superconducting coil;
a first lower local reservoir associated with the first lower superconducting coil for cooling the first lower superconducting coil;
a second lower local reservoir associated with the second lower superconducting coil for cooling the second lower superconducting coil;
the liquid medium cooling circuit guiding the liquid cooling medium from the first upper local reservoir to the second upper local reservoir to the first lower local reservoir and to the second lower local reservoir.

13. The MRI system as claimed in claim 12, wherein each local reservoir includes an overflow edge for the liquid cooling medium which is located at or above a lower side of the associated superconducting coil.

14. The MRI system as claimed in claim 12, wherein the cryogenic container includes:
an upper portion which encloses the first and second upper superconducting coils and the first and second upper local reservoirs;
a lower portion which houses the first and second lower superconducting coils and the first and second lower local reservoirs; and,
a connecting portion which connects the upper and lower portions such that liquid cooling medium flows downward through the connecting portion from the second upper local reservoir to the first lower local reservoir and the gaseous cooling medium rises upward from the lower portion through the connecting portion to the top of the upper portion.

15. The MRI system as claimed in claim 14, further including:
a well at a bottom of the lower portion into which liquid cooling medium flows after the second lower local reservoir; and
a sensor disposed in the well for determining a level of liquid cooling medium.

16. The MRI system as claimed in claim 10, further including:
a third upper superconducting coil; and,
a third lower superconducting coil;
the liquid cooling medium circuit guiding the liquid cooling medium from the second upper superconducting coil to the third upper superconducting coil and then to the first lower superconducting coil, and guiding the liquid cooling medium from the second lower superconducting coil to the third lower superconducting coil.

17. The MRI system as claimed in claim 16, further including:
a fourth upper local superconducting coil; and,
a fourth lower local superconducting coil;
the liquid cooling medium circuit guiding the liquid cooling medium from the third upper superconducting coil to the fourth upper superconducting coil and then to the lower superconducting coils.

* * * * *